United States Patent
Zucker (12)

(10) Patent No.: US 7,296,753 B1
(45) Date of Patent: Nov. 20, 2007

(54) ISOLATED CONTROL APPARATUS INCORPORATING LIGHT CONTROLLED POWER SEMICONDUCTORS

(75) Inventor: Oved Shlomo Frank Zucker, Washington, DC (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 09/484,376

(22) Filed: Jan. 14, 2000

(51) Int. Cl.
*G06K 7/10* (2006.01)

(52) U.S. Cl. .................................. 235/462.48; 235/454
(58) Field of Classification Search .......... 235/462.48; 257/82–83, 113, 116, 500; 363/132–134; 323/224, 282, 284
See application file for complete search history.

(56) References Cited

U.S. PATENT DOCUMENTS 4,126,819 A * 11/1978 Stobbe et al.
4,485,434 A * 11/1984 Beeston et al.
5,323,305 A * 6/1994 Ikeda et al.
6,218,682 B1 * 4/2001 Zucker et al.

OTHER PUBLICATIONS

IBM Technical Disclosure Bulletin: Optical Switch, Nov. 1986, US volume No. 29; 3 pages.*
IBM Technical Disclosure Bulletin: Laser Diode Control Circuits, Jun. 1, 1987, US volume No. 30; 3 pages.*

* cited by examiner

*Primary Examiner*—Lisa Caputo
(74) *Attorney, Agent, or Firm*—Rossi, Kimms & McDowell LLP

(57) ABSTRACT

A system for direct optical control of electronic power semiconductors includes an optical triggering circuit at a first location, wherein said optical triggering circuit generates an optical trigger signal, a power circuit located at a second location remote from the first location, wherein said power circuit includes a photoconductor that is responsive to the optical trigger signal generated by the optical triggering circuit, and an optical cable coupling the optical triggering circuit to the power circuit. In operation, the power circuit is directly driven by the transmission of the optical trigger signal from the optical triggering circuit to the power circuit via the optical cable.

14 Claims, 6 Drawing Sheets

| LASER ENERGY AND POWER REQUIREMENTS | PHOTOCONDUCTOR STRUCTURE | | | |
|---|---|---|---|---|
| | DIODE | | THYRISTOR | |
| | ON | OFF | ON | OFF |
| LASER PULSE ENERGY (µJ) | 1.37 | 1.05 | .0145 | .009 |
| LASER POWER PEAK (w) | 27.4 | 3.3 | .291 | .003 |
| LASER POWER AVERAGE (mw) at 100 kHz | 137 | 100 | 1.45 | .091 |

FIG. 5

ISOLATED CONTROL APPARATUS INCORPORATING LIGHT CONTROLLED POWER SEMICONDUCTORS

FIELD OF THE INVENTION

The invention relates in general to control of power semiconductor devices. More specifically, the invention relates to an apparatus for controlling power semiconductor devices wherein optical isolation is provided between a benign environment containing control processing circuitry and a harsh environment containing the power semiconductor devices and a driven load.

BACKGROUND OF THE INVENTION

It is desirable in many control applications to remove sensitive electronics from a harsh environment in which a power semiconductor and a driven load are located. Power semiconductors, for example, are used to control heavy machinery motors, robotics, flight actuators and other devices that are usually located in harsh environments having high temperatures, radiation and vibration. While existing power semiconductors (Thyristors, GTO's, IGBT's, etc.) can tolerate temperatures in excess of 100° C., information processing electronics, such as microprocessors, require a more benign temperature environment in order to properly operate. It is therefore necessary to provide isolation between the harsh environment of the power semiconductors and the benign environment required by the information processing electronics.

One particular application in requiring isolation is in the field of flight controls. Efforts have been made to replace conventional hydraulic control systems with electronic control systems such that electronic commands are sent to actuators through wire connections. These so called "Fly-By-Wire" (FBW) systems provide many advantages over conventional hydraulic control systems, including substantial reductions in vehicle weight and complexity, but can still be susceptible to problems associated with electro magnetic interference (EMI). Accordingly, shielding techniques must be employed to prevent spurious EMI signals, sometimes generated by the control system itself, from causing disruptions in flight control operations.

A Fly-By-Light (FBL) concept proposes a flight vehicle in which the performance of all-sensing and flight control actuation is performed with a DC power distribution system and an optical network to carry all-sensing and control information to and from a centrally located Vehicle Management System (VMS) computer. Such a system would not only be immune to EMI, but would not generate significant EMI itself. In addition, beyond the EMI benefits, substantial weight, volume and cost savings, and enhanced reliability and safety could be realized.

The major technological hurdles in implementation of a FBL system are concentrated at the terminal points of the optical system. The outgoing information carrying optical signal needs to control a function, but most of the control functions involve substantial electrical power, be it the control of a motor, a valve or the control and conditioning of the power itself to, or in electronic systems such as radar or weapons systems. These functions are conventionally performed with power semiconductors that operation in tens of kW power levels. The mere triggering of these devices, however, requires hundreds of Watts.

The general concept of optical isolation is well known, but present optical communication systems transmit power at milli-watts levels. Thus, the transition from the optical world to the electrical world is fundamentally mismatched and is performed in circuitous fashion resulting in expensive and inherently sensitive hardware, namely, optical control of semiconductors is conventional performed only indirectly through an optical to electrical interface which then controls the power semiconductor. Thus, conventional optical communication systems still require low power sensitive components to be present in the harsh environment in order to convert the weak optical signal into an electrical signal strong enough to trigger the power semiconductors. Accordingly, it is an object of the invention to provide a system for optical isolation that includes direct optical control of electrical power semiconductors.

SUMMARY OF THE INVENTION

A system for direct optical control of electronic power semiconductors includes an optical triggering circuit at a first location, wherein said optical triggering circuit generates an optical trigger signal, a power circuit located at a second location remote from the first location, wherein said power circuit includes a photoconductor that is responsive to the optical trigger signal generated by the optical triggering circuit, and an optical cable coupling the optical triggering circuit to the power circuit. In operation, the power circuit is directly driven by the transmission of the optical trigger signal from the optical triggering circuit to the power circuit via the optical cable.

A control processor is generally coupled to the optical triggering circuit, wherein the optical triggering circuit is responsive to receipt of a command signal from the control processor to generate the optical trigger signal. Similarly, the power circuit is used to drive a load such as a DC motor or other device.

In a preferred embodiment, the power circuit includes at least one leg including a pair of transistors, each transistor including a base coupled in series to a photoconductor, wherein activation of the photoconductor turns on the transistor. A shunt photoconductor is also preferably coupled to the base of each transistor, wherein activation of the shunt photoconductor turns off the transistor.

A conventional diode with a modified electrode structure can be utilized for the photoconductor. In a preferred embodiment, the modified electrode structure includes a plurality of strips formed on a surface of the photoconductive diode. The strips can be made to intersect to form a grid pattern if desired. In a further embodiment, a photoconductively controlled channel transistor is employed as the photoconductor.

Other modifications, variations and advantages will become apparent to those of ordinary skill in the art from the following detailed description of the preferred embodiments of the invention and the accompanying drawings.

BRIEF DESCRIPTION OF THE DRAWINGS

The invention will now be described with reference to certain preferred embodiments thereof and the accompanying drawings, wherein:

FIG. 5 is a table illustrating laser energy requirements for photoconductive structures;

DETAILED DESCRIPTION OF THE PREFERRED EMBODIMENTS

Figure 1:
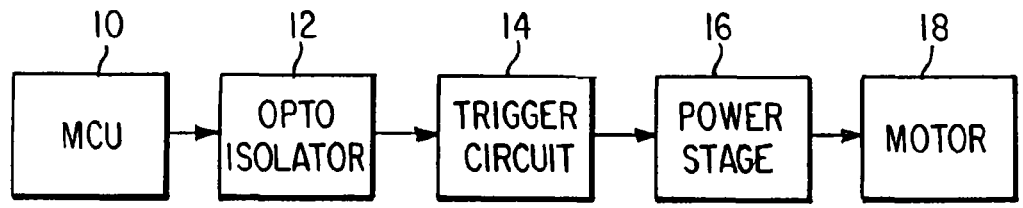
FIG. 1 is a schematic block diagram of a conventional motor control architecture.

A typical flight control motor circuit block diagram is illustrated in FIG. 1. A Motor Control Unit (MCU) 10 establishes the servo loop closure and drive logic for motor current commutation and full four-quadrant control. The Motor Control Unit (MCU) 10 is coupled by a conventional opto-isolator 12 to a trigger circuit 14. The trigger circuit 14 is in turn coupled to a power stage drive circuit 16 used to drive a DC motor 18. In operation, the MCU 10 transmits an electrical command signal to the opto-isolator 12, which converts the electrical command signal into a low power optical signal that is supplied to the trigger circuit 14. The trigger circuit 14 converts the low power optical signal received from the opto-isolator 12 into an electrical signal which then triggers the power stage drive circuit 16 to control the operation of the motor 18. In this architecture, the use of the opto-isolator 12 protects the MCU 10 from the high voltage associated with the trigger circuit 14 and power stage drive circuit 16.

Figure 2:
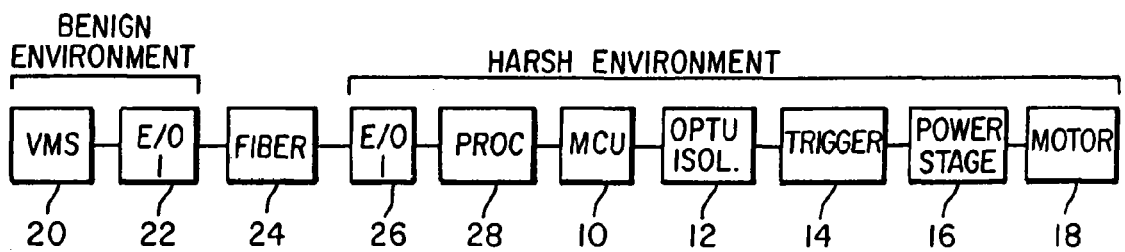
FIG. 2 is a schematic block diagram of the conventional motor control architecture illustrated in FIG. 1 incorporated in a FBL architecture.

FIG. 2 illustrates the implementation of the conventional motor control architecture in a FBL architecture. A VMS 20 computer generates position commands for flight control actuators based on various inputs (pilot, navigation, etc.) and sensor information. The position commands are fed to the MCU 10 via an optical data bus that includes an electrical/optical (E/O) interface transmitter 22, a fiber optic cable 24 and an E/O interface receiver 26. The E/O interface receiver 26 is coupled to processing circuitry 28 that converts the signal received from the E/O interface receiver 26 into a digital position command for the MCU 10. From this point on, the control flow mimics that shown in FIG. 1 with the opto-isolator 12, trigger circuit 14 and power stage 16 provided before the motor 18. In the illustrated architecture, the VMA 20 and E/O interface transmitter 22 remain in a relatively benign environment (for example the cockpit of the aircraft), however, the processing circuitry 28, MCU 10 and trigger circuit 14 must be provided in a harsh environment (for example in the wing structure where a flight control motor is located) that includes the power stage 16 and motor 18 and therefore remain susceptible to EMI. In this architecture, the low power signal generated by the E/O interface transmitter 22 is insufficient to effective direct drive of the power stage 16.

Figure 3:
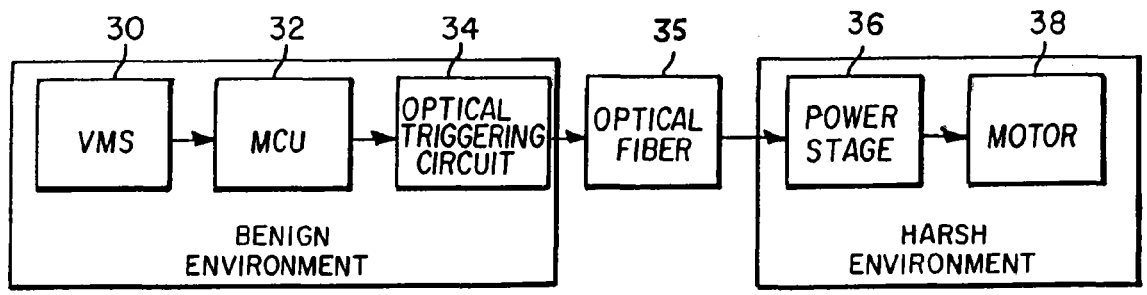
FIG. 3 is a FBL architecture in accordance with the present invention.

Referring now to FIG. 3, an isolation architecture in accordance with the present invention is shown in which a VMS 30 is coupled to a local MCU32 that is coupled to an optical trigger circuit 34, wherein each of these components is located within a relatively benign evironment. An optical fiber 35 is provide to couple the optical trigger circuit 34 to a power stage drive circuit 36 which is used to control DC motor 38. In this architecture, the only components within the harsh environment are the power stage 36 and the motor 38. The optical trigger circuit 34 operates a trigger power level that is sufficient to directly trigger the power stage 36.

Figure 4:
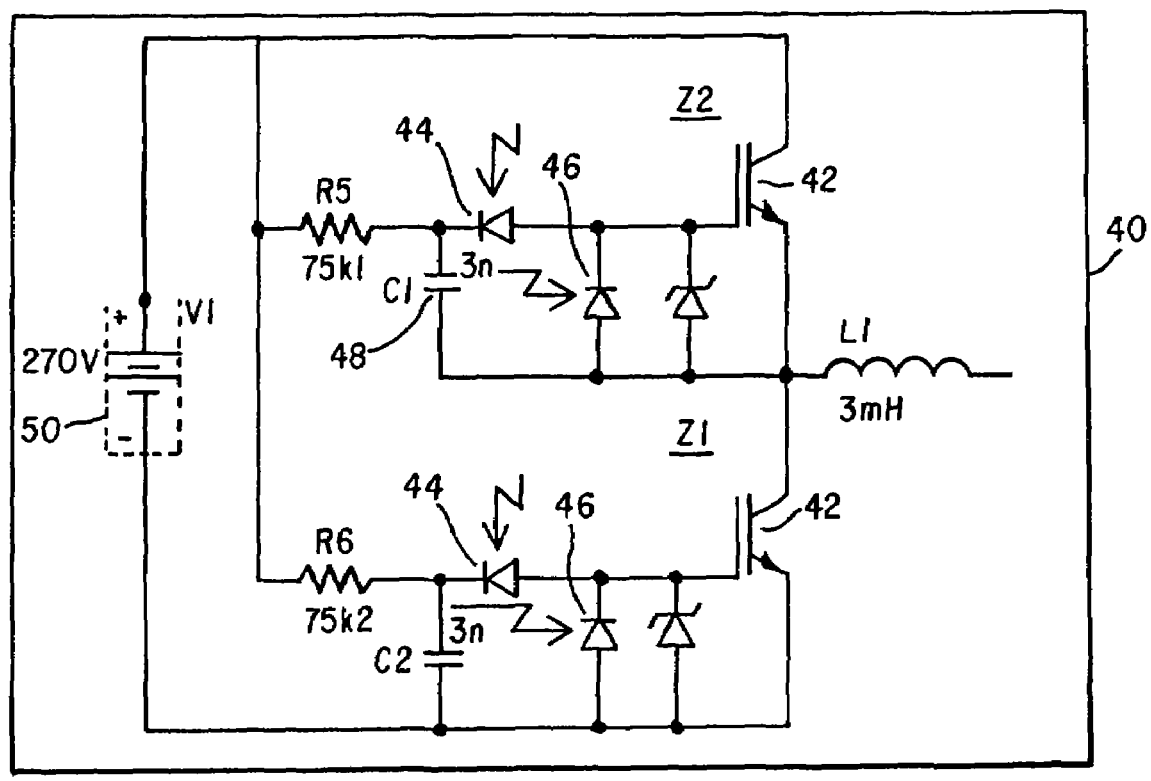
FIG. 4 is a schematic diagram illustrating one leg of a circuit utilized in the power stage circuit of the architecture illustrated in FIG. 3.

A single leg of a preferred photoconductively controlled power stage circuit 40 to be utilized in the power stage 36 is illustrated in FIG. 4. While only a single leg is shown for purposes of simplification, it will be understood that the illustrated architecture can be readily incorporated into a mult-leg H-bridge motor circuit or equivalent drive circuit. As shown in FIG. 4, IGBT's 42 have their gates coupled in series to high power photoconductors 44 which, when directly activated by a light signal, charge the gates to 15V in order to turn on the IGBT's 42, and shunt photoconductors 46 are provided which, when directly activated by a light signal, drain the gate charge to turn the IGBT's off.

The IGBT gates can be viewed as 50nF capacitors that are charged to 15V to turn the IGBT on and then discharged to ~0v to turn the IGBT off. To turn the device on in 50ns requires a current of ~CV/t=20A for ~50ns. As FIG. 4 shows, the preferred architecture does away with a conventional trigger power supply by charging a capacitor 48 to the full 270V of the DC source 50. This is a charge conserving circuit, which upon activation of the photoconductors 44 settles to the 15V level required by the IGBTs to turn on. The photoconductors are back-biased Silicon junctions. The charge needed to affect activation can be as low as a few nano Joules (nJ) with a Thyristor configured photoconductor and around a µJ with a back-biased diode (single junction) photoconductor. Parameter values for the two photoconductor variants are given in the table illustrated in FIG. 5.

From FIG. 5, in can be seen that the laser energy required is between a nJ and a µJ, depending on the type (on vs. off) and whether a thyristor or diode configuration photoconductor is utilized. The thyristor configuration is more economical because it latches on, and turns off only when the current stops flowing. With the load being the gate capacitance the current naturally stops as soon as the voltage on both sides equalize giving the SCR ample time to revert to the off position without affecting the gate voltage. The diode configuration will limit the charge transfer to that created by the photon absorption and provide great flexibility but at greater cost in light. While each has its advantages, the average power is under a Watt in all cases, with the peak power limited to a maximum of 27W for the diode on function. A typical pulsed laser diode of the PGA series manufactured by EG&G Canada, is in the 100W peak range which is ample for the task. Accordingly, these laser diodes and their drivers are suitable for use as the optical triggering circuit 34, which is situated on the VMS side of the optical fiber cable 36, where they will not be subjected to the harsh environment.

Figure 6:
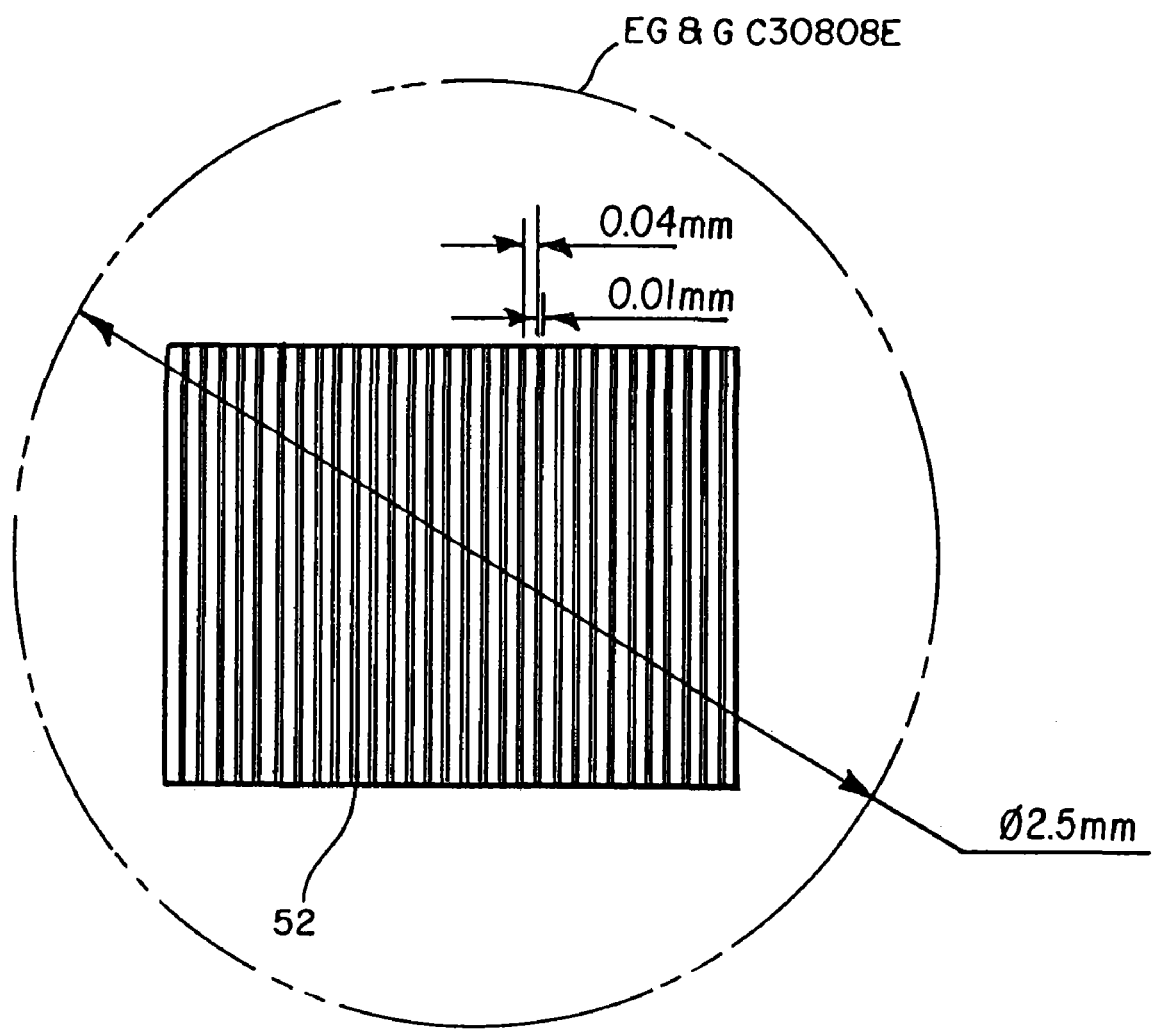
FIG. 6 illustrates a modified electrode structure provided on a surface of a conventional diode.

There are a number of devices that can be implemented for use as the photoconductors 44, 46. As explained above, it will be necessary for the photoconductors 44, 46 to carry relatively high current densities. It has been found that a conventional diode can be modified to achieve the operational performance required of the system architecture described above, namely, a C30808E diode manufactured by EG&G Canada can be modified to carry 20 to 100 A for about 50 ns, in response to flooding the modified device with light from a 50W PGA type laser diode for about 50 ns, by the application of a modified electrode structure to the conventional diode. As shown in FIG. 6, the modified electrode structure 52 includes a plurality of gold electrode strips provided on the surface of the diode, with each strip having a width of about 10 µm and a thickness of between 0.25-1.0 µm. The strips are separated by gaps have a width of about 40 µm. The addition of the electrode strips allows for increased current densities with only a small voltage drop. The modified electrode structure is not limited to strips, but may also include a grid pattern of intersecting strips.

Figure 7:
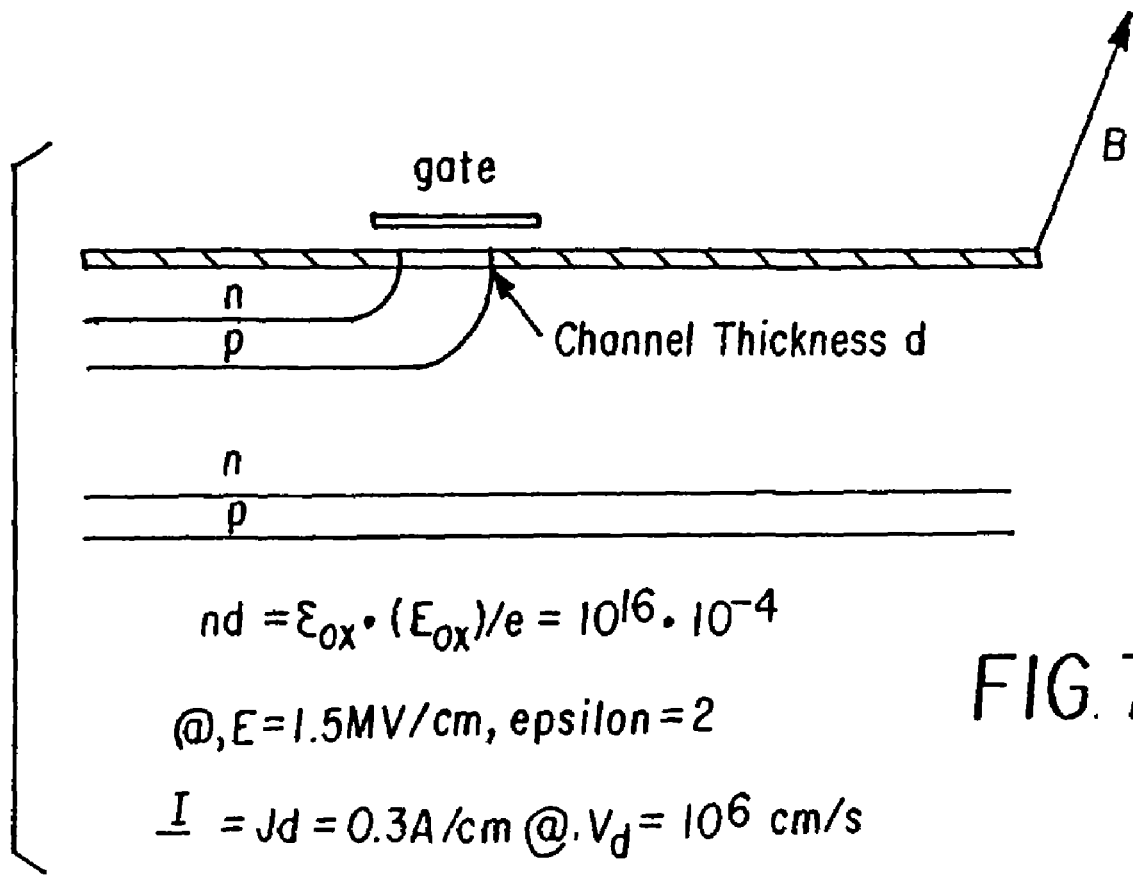
FIG. 7 illustrates a conventional MOS structure.

An alternative to modification of a conventional low current density diode as described above is the use of a photoconductively controlled channel transistor (PCCT). A power semiconductor can be turned off either by stopping the injection through shorting as in an MCT or diversion as in a GTO or through the control of the base current as in a transistor. The MCT uses a MOS structure to short the injecting junction and the IGBT uses a MOS structure to control the base current in a transistor in the Darlington configuration. A fundamental distinction is the amount of current the MOS needs to carry. In the MCT, the MOS carries the full current for the turnoff duration. In the IGBT, the MOS carries a fraction of the current for the full on duration. The current capability of the MOS device is substantially lower than that of a bipolar device, which results in a substantial allocation of device real-estate to the MOS control region. The limitation of a MOS channel to carry current results from the fundamental limit of the gate oxide to hold voltage and limits the product of the channel thickness (d) and its carrier concentration (n) to 1 µ at $10^{16}$, which in turn limits the current to 0.4 A/cm even at drift velocities as high as $10^6$ cm/s (See FIG. 7). The later is a material limit which peaks at a carrier concentration of $10^{16}$ with a channel depth of 1µ.

Figure 8:
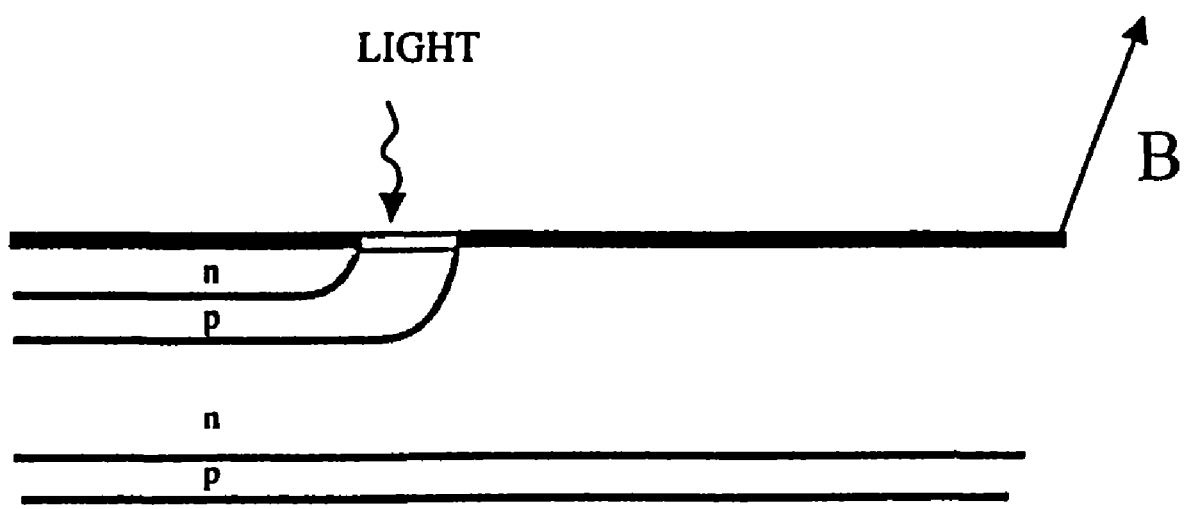
FIG. 8 illustrates a photoconductively controlled channel transistor.

A channel created with photos has no such limitation, it can be both deeper and of higher carrier concentration. The same channel created by the absorption of light can have a higher carrier concentration and greater depth resulting in 1 to 2 orders higher n*d product. In turn, it provides a lower drop and greater utilization of real estate. The photoconductively controlled channel transistor (PCCT) 54 illustrated in FIG. 8, for example, allows the light created in the channel to act as a phototransistor, where the light required to maintain the on state is reduced by the Darlington configuration $\beta_1$ and the phototransistor $\beta_2$. The larger channel and higher carrier concentration allows the channel to carry higher current, which results in higher power capability for a given device real estate. Thus, the device will exhibit higher speed, power and lower on resistance than a conventional IGBT.

The invention has been described with reference to certain preferred embodiments thereof. It will be understood, however, that modifications and variations are possible within the scope of the appended claims. For example, the preferred embodiment was illustrated with reference to flight control systems. The invention, however, is not limited to this application, but instead, can be utilized in any situation in which sensitive control circuitry must be isolated from less sensitive power circuitry located in a harsh environment.

What is claimed is:

1. An apparatus for controlling a control surface of an aircraft comprising:
   an optical triggering circuit at a first location within a substantially benign electronic environment including a cockpit of the aircraft, wherein said optical triggering circuit generates an optical trigger signal;
   a power circuit located at a second location remote from the first location within a substantially harsh electronic environment including a wing structure of the aircraft containing the control surface, wherein said power circuit includes at least one photoconductor that is responsive to the optical trigger signal generated by the optical triggering circuit; and
   an optical cable coupling the optical triggering circuit to the power circuit;
   wherein the power circuit is directly driven by the transmission of the optical trigger signal from the optical triggering circuit to the power circuit via the optical cable;
   wherein the power circuit includes at least one leg including a pair of transistors, each transistor including a base coupled in series to a corresponding photoconductor, wherein activation of the corresponding photoconductor turns on the transistor coupled thereto;
   wherein at least one corresponding photoconductor comprises a photoconductive diode including a modified electrode structure comprising a plurality of strips formed on a surface of the photoconductive diode.

2. An apparatus as claimed in claim 1, further comprising a control processor coupled to the optical triggering circuit at the first location, wherein the optical triggering circuit is responsive to receipt of a command signal from the control processor to generate the optical trigger signal.

3. An apparatus as claimed in claim 1, further comprising a DC motor coupled to an output of the power circuit at the second location.

4. An apparatus as claimed in claim 1, further comprising a corresponding shunt photoconductor coupled to the base of each transistor, wherein activation of the corresponding shunt photoconductor turns off the transistor coupled thereto.

5. An apparatus as claimed in claim 4, wherein at least one corresponding shunt photoconductor comprises a photoconductive diode including a modified electrode structure.

6. An apparatus as claimed in claim 5, wherein the modified electrode structure includes a plurality of strips formed on a surface of the photoconductive diode.

7. An apparatus as claimed in claim 6, wherein the strips have a width of about 10 µm.

8. An apparatus as claimed in claim 6, wherein the strips have a thickness of between 0.25-1.0 µm.

9. An apparatus as claimed in claim 8, wherein the strips are separated by gaps having a width of about 40 µm.

10. An apparatus as claimed in claim 1, wherein the strips have a width of about 10 µm.

11. An apparatus as claimed in claim 1, wherein the strips have a thickness of between 0.25-1.0 µm.

12. An apparatus as claimed in claim 11, wherein the strips are separated by gaps having a width of about 40 µm.

13. An apparatus as claimed in claim 1, wherein the optical triggering circuit utilizes a laser diode to generate the optical triggering signal.

14. An apparatus as claimed in claim 1, wherein each corresponding photoconductor can carry a current at least 20 A for 50 ns.

* * * * *